Figure 1:
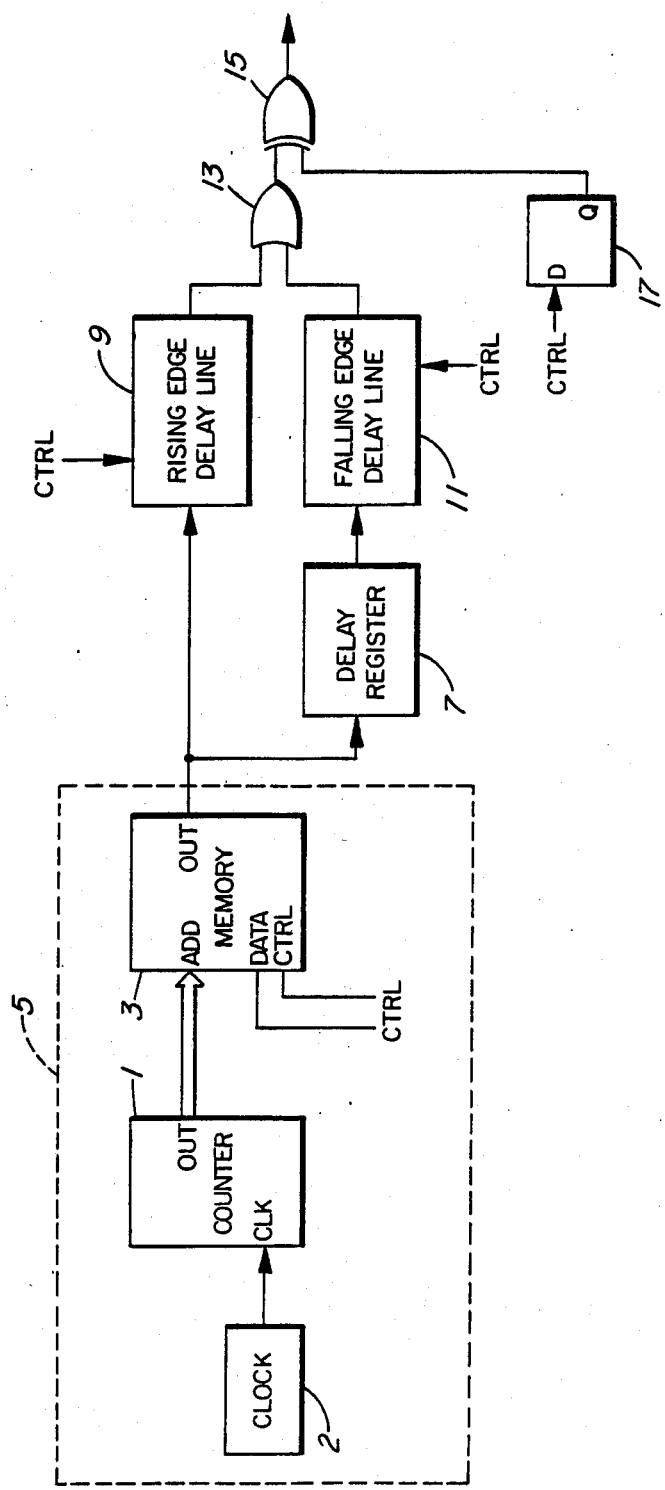

United States Patent [19]

Shaw

[11] Patent Number: 4,675,546
[45] Date of Patent: Jun. 23, 1987

[54] EDGE PROGRAMMABLE TIMING SIGNAL GENERATOR

[75] Inventor: John R. Shaw, Woodlawn, Canada

[73] Assignee: Mosaid, Inc., Canada

[21] Appl. No.: 893,033

[22] Filed: Aug. 4, 1986

[30] Foreign Application Priority Data

Aug. 6, 1985 [CA] Canada .................................. 488171

[51] Int. Cl.[4] ........................ H03K 5/04; H03K 3/017
[52] U.S. Cl. ................... 307/265; 307/268; 307/601; 307/602; 328/58; 328/61
[58] Field of Search ............... 307/265, 268, 601, 602, 307/606, 608; 328/58, 61

[56] References Cited

U.S. PATENT DOCUMENTS

| 3,124,705 | 3/1964 | Gray, Jr. | 307/265 |
| 3,443,232 | 5/1969 | Stinson | 307/265 |
| 3,489,925 | 1/1970 | Bjerke | 307/265 |

Primary Examiner—John S. Heyman
Assistant Examiner—Trong Quang Phan
Attorney, Agent, or Firm—Laff, Whitesel, Conte & Saret

[57] ABSTRACT

An inexpensive edge programmable timing signal generator for generating timing signals having complete edge programmability for accommodating incrementally adjustable variable pulse widths. The timing circuit is particularly useful in memory testing devices, where generation of a multiplicity of clock phases is required. A delay register delays an input timing signal generated by a coarse timing circuit by a predetermined amount of time, and a pair of rising and falling edge delay lines receive and delay the input and delayed timing signals by further predetermined amounts of time. The signals output from the rising and falling edge delay lines are applied to an OR gate, the output of which is applied to an EXCLUSIVE OR gate for selectively inverting the signal output from the OR gate. The circuit is inexpensive and takes up very little circuit board area.

19 Claims, 12 Drawing Figures

EDGE PROGRAMMABLE TIMING SIGNAL GENERATOR

This invention relates in general to signal generators, and more particularly to an edge programmable timing signal generator for generating timing signals having variable pulse widths.

Timing generators are well known for providing control, clock and test signals for a plurality of applications in the fields of computer science and communications. In addition, simple accurate pulse or waveform generators are utilized in testing the performance of electronic circuits in relation to various input signals. Such timing circuits are typically required to generate signals having programmable phases and pulse widths.

Certain low cost prior art timing generator circuits have utilized delay lines to successfully generate signals having pulse widths equal to or greater than a predetermined input clock signal pulse width. These circuits however are typically unable to generate short, high or low going pulse signals having pulse widths less than the pulse width of the input clock signal.

On the other hand, a number of well known expensive timing generator circuits are capable of producing signals having complete edge programmability such that any defined pulse width is accommodated within any portion of an input clock signal period, or extending between two such clock periods. However, such circuits typically require a multiplicity of adders, counters and registers for their implementation, resulting in considerable expense and complexity.

According to the present invention, a simple and inexpensive circuit is provided for generating timing signals having complete edge programmability for accommodating incrementally adjustable variable pulse widths. The timing circuit according to the present invention, is particularly useful in memory testing circuits, where a multiplicity of clock phases (for instance eight), are required.

In general, the invention is an edge programmable timing signal generator, comprised of circuitry for generating an input timing signal having predetermined logic high pulse width, circuitry for receiving and delaying the input timing signal by a predetermined length of time and generating a delayed input timing signal in response thereto, circuitry for receiving and delaying the input timing signal by a first variable length of time less than or equal to the predetermined length of time and generating a rising edge signal in response thereto, circuitry for receiving and delaying the delayed input timing signal by a second variable length of time less than or equal to the predetermined length of time and generating a falling edge signal in response thereto, circuitry for receiving and performing a logic OR operation on the rising and falling edge signals and generating a first output signal in response thereto, and circuitry for selectively inverting the input and output signals and generating a second output signal in response thereto, whereby the first output signal has a logic high pulse width variable between the predetermined pulse width and the predetermined pulse width extended by twice the predetermined length of time in response to variations in the first and second variable lengths of time, and the second output signal has a logic high pulse width variable between the predetermined pulse width and the predetermined pulse width diminished by twice the predetermined length of time in response to variations in the first and second variable lengths of time.

The invention is also a method of generating an output timing signal having variable positive pulse width, comprising the steps of generating an input timing signal having a predetermined logic high pulse width, receiving and delaying the input timing signal by a first predetermined length of time and generating a delayed input timing signal in response thereto, receiving and delaying the input timing signal by a second predetermined length of time less than or equal to the first predetermined length of time and generating a rising edge signal in response thereto, receiving and delaying the delayed input timing signal by a third predetermined length of time less than or equal to the first predetermined length of time and generating a falling edge signal in response thereto, receiving and performing a logic OR operation on the rising and falling edge signals and generating a first output signal in response thereto, and selectively inverting the input and output signals and generating a second output signal in response thereto, whereby the first output signal has a logic high pulse width variable between the predetermined pulse width and the predetermined pulse width extended by twice the first predetermined length of time in response to variations in the second and third predetermined lengths of time, and the second output signal has a logic high pulse width variable between the predetermined pulse width and the predetermined pulse width extended by twice the first predetermined length of time in response to variations in the second and third predetermined lengths of time, and the second output signal has a logic high pulse width variable between the predetermined pulse width and the predetermined pulse width diminished by twice the first predetermined length of time in response to variations in the second and third predetermined lengths of time.

Figure 2A:
Figure 2B:
Figure 2C:
Figure 2D:
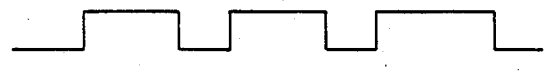
Figure 2E:
Figure 2F:
Figure 2G:
Figure 2H:
Figure 2I:
Figure 3:
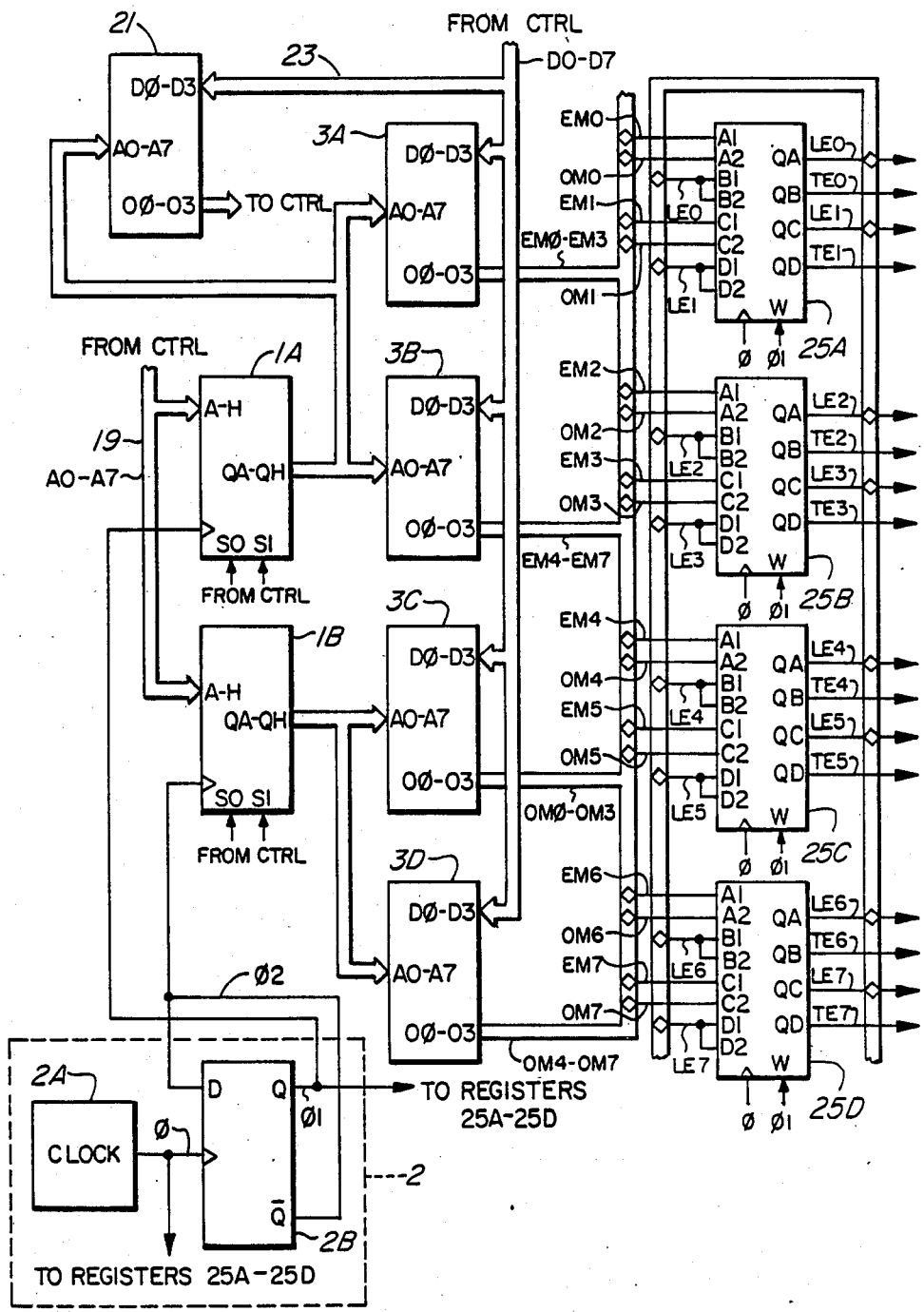
Figure 4:
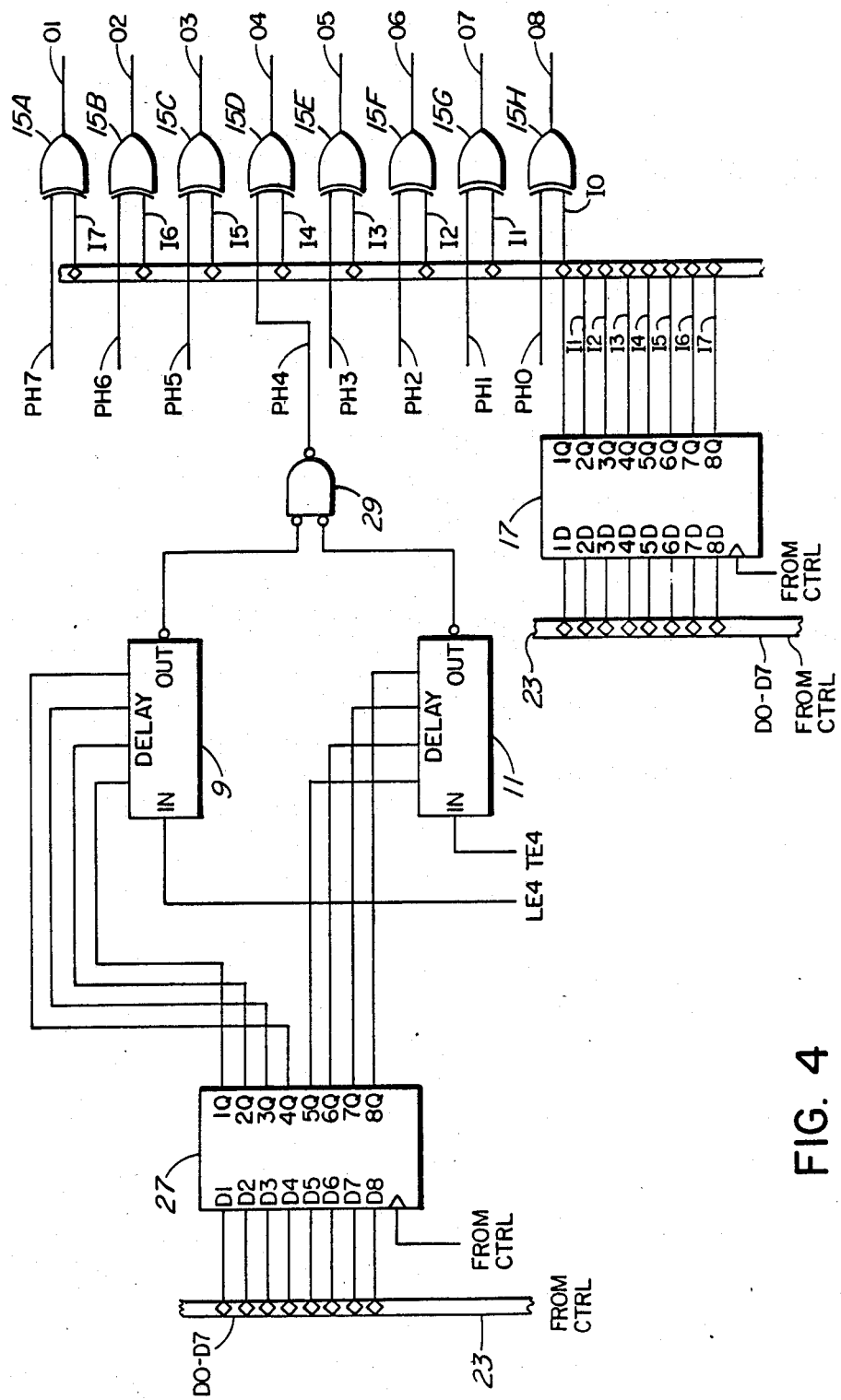

A better understanding of the present invention will be obtained by reference to the detailed description below in conjunction with the following drawings, in which:

FIG. 1 is a schematic diagram of a timing signal generator circuit according to the present invention, FIG. 2 comprised of FIGS. 2A-2I is a timing diagram illustrating a plurality of timing signals having various pulse widths, generated according to the circuit of FIG. 1, FIG. 3 is a detailed schematic diagram of a coarse timing circuit according to the preferred embodiment of the present invention, and FIG. 4 is a detailed schematic diagram of delay line circuitry according to the preferred embodiment.

With reference to FIG. 1, a digital binary counter 1 is shown having a clock input CLK thereof connected to a clock circuit 2, and a parallel output OUT thereof connected to address inputs ADD of a memory circuit 3. The memory circuit 3 is loadable via DATA inputs thereof and operated under control of an external controller CTRL, such as a microprocessor, not shown.

Counter 1, clock 2 and memory circuit 3 in combination form a coarse timing circuit denoted as 5, for generating a timing signal having pulse widths which are variable by coarse time increments, discussed further below.

In operation, memory circuit 3 is initially loaded via the DATA inputs thereof with digital signals corresponding to a plurality of clock phases. In a successful prototype, eight such clock phases were accommodated. Thus, a predetermined bit of a data signal stored in memory circuit 3 corresponds with a logic high or logic low level of a generated signal of the clock phase corresponding to the predetermined bit.

Binary counter 1 generates address signals via the outputs thereof in response to clock circuit 2 generating and applying timing or clock signals to the CLK input thereof.

The output of coarse timing circuit 5 (i.e. the OUT terminal of memory circuit 3) is connected to a delay register 7 for delaying the generated coarse timing signal by a predetermined length of time, which in the preferred embodiment was 16 nanoseconds. The output from coarse timing circuit 5 is also applied to a rising edge delay line 9, and the output of delay register 7 is applied to a falling edge delay line 11. Delay register 7 is utilized to ensure that signals having extremely short pulse widths can be programmed, as discussed in further detail below.

The two delayed signals from delay lines 9 and 11 are combined via OR gate 13, the output of which is connected to a first input of EXCLUSIVE OR gate 15. A second input of EXCLUSIVE OR gate 15 is connected to a Q output of an inversion register 17. The data input D of inversion register 17 is connected to the external controller CTRL.

For the purpose of this description, reference will be made to high going pulses having logic high level, variable pulse widths.

In operation, referring to FIGS. 1 and 2, a coarse timing signal is shown in FIG. 2A having a predetermined logic high level pulse width, for example 32 nanoseconds. The signal output from delay register 7 is shown in FIG. 2B offset by a predetermined length of time (eg. 16 nanoseconds) from the input coarse timing signal of FIG. 2A. With no delay programmed into either of the delay lines 9 or 11, the signal output from OR gate 13 is shown in FIG. 2C.

In order to generate signals having logic high level pulse widths greater than or equal to the pulse width of the coarse timing input signal, the external controller CTRL loads a logic low signal into the D input of inversion register 17, which in response applies a logic low signal to the second input of EXCLUSIVE OR gate 15 via the Q output of the inversion register. Thus, the signal output from EXCLUSIVE OR gate 15 is identical to the signal output from OR gate 13 (with the exception of propagation delays) as shown in FIG. 2C.

As a first example, in the event it is desired to generate a signal having a pulse width less than that shown in FIG. 2C yet greater than the pulse width of the input signal, the controller CTRL loads a delay factor into rising edge delay line 9 such that the output signal from delay line 9 is delayed a predetermined amount (less than the delay of delay register 7), as designated by the letter "D" and the dashed lines in FIG. 2A. In response, the signal output from OR gate 13 (and consequently EXCLUSIVE OR gate 15) is shown in FIG. 2D.

As a second example, in the event it is desired to generate a signal having a pulse width greater than that shown in FIG. 2C, the external controller CTRL loads a delay factor into falling edge delay line 11, as shown in dashed lines and designated by the letter "E" in FIG. 2B. In response, OR gate 13 and consequently EXCLUSIVE OR gate 15 generate the signal illustrated in FIG. 2E. It can be seen that by programming falling edge delay line 11 to delay the signal from delay register 7 by an amount equal to the delay of delay register 7, it is possible to generate a logic high level DC signal from OR gate 13 and EXCLUSIVE OR gate 15 since at least one of the signals output from delay lines 9 and 11 (illustrated in FIGS. 2A and 2B) would be at a logic high level at any given instant in time.

It is possible to do either of the above, or both, in order to generate a low going pulse, having predetermined programmable rising and falling edges which define a pulse width which is less than the minimum pulse width generated by the coarse timing memory circuit 5. However, in order to generate short high going pulses, a short low going pulse is generated as described above, and the pulse is subsequently inverted via EXCLUSIVE OR gate 15 as discussed below.

In particular, the external controller CTRL causes the coarse timing signal output from circuit 5 to be inverted, and loads a logic high signal into inversion register 17 for application to the second input of EXCLUSIVE OR gate 15. In the preferred embodiment, the external controller reloads memory circuit 3 with data signals which are inverted with respect to those originally stored therein, in order to invert the signal output from coarse timing circuit 5.

By loading delay line 9 with the aforementioned delay factor, a signal is output from OR gate 13 as shown in FIG. 2F. EXCLUSIVE OR gate 15, with a logic high signal applied to the second input thereof, acts effectively as an inverter for inverting the signal from OR gate 13 and generating a signal having pulse width less than the pulse width of the input signal, as illustrated in FIG. 2G.

In order to generate a signal having yet a shorter pulse width, the aforementioned delay factor is loaded into delay line 11, which results in OR gate 13 generating a signal as illustrated in FIG. 2H. This signal is inverted by EXCLUSIVE OR gate 15 in order to generate the signal shown in FIG. 2I. It can be seen from FIG. 2 that in the event the delay factor in delay line 11 is increased up to the delay of delay register 7, a logic low DC signal is generated, since as discussed above, at least one of the signals output from delay lines 9 and 11 would be at a logic high level and subsequently inverted in EXCLUSIVE OR gate 15 to a logic low level at any given instant in time.

Thus, by inverting the signals input to rising and falling edge delay lines 9 and 11, and inverting the signal output from OR gate 13, rising and falling edges are generated at any time during the period of the coarse timing signal.

Turning to the detailed schematic diagram of coarse timing circuit 5 illustrated in FIG. 3, counter 1 is preferably comprised of a pair of alternately clocked counters 1A and 1B having clock inputs connected to the output of clock circuit 2 such that the counters are clocked on opposite phases of the square clock signal output from circuit 2. Clock circuit 2 is preferably comprised of a master clock 2A for generating a 62.5 megahertz signal, $\phi$ which is applied to a clock input of flip-flop 2B, the $\overline{Q}$ output of flip-flop 2B carries a clock signal $\phi 2$ for application to counter 1B and to the D input of the flip flop. The Q output carries a clock signal $\phi 1$ for application to counter 1A. Preload data inputs A–H of counters 1A and 1B are connected to an address bus 19 connected to the external controller CTRL, discussed with reference to FIG. 1. The QA–QH outputs of counters 1A and 1B are connected to 8 bit address inputs A0–A7 of 4 bit wide RAMs 3A, 3B and 3C, 3D respectively. RAMs 3A, 3B and 3C, 3D effectively combine to form two separate 256×8 bit memories for generating a total of 8 clock phases, wherein each phase is assigned a 1 bit wide word in each of the RAMs.

With clock circuit 2 generating two nominal opposite phase 62.5 megahertz signals $\phi1$ and $\phi2$, each location of the RAMs 3A, 3B and 3C, 3D corresponds to a 16 nanosecond increment of time for each of the 8 clock phases.

The external control circuit CTRL generates signals for application to the S0 and S1 inputs of counters 1A and 1B. When S1 and S0 are both at logic low levels, the counters are cleared, when S1 and S0 are at logic low and logic high levels respectively, the counters count downward, when the S1 and S0 inputs are at logic high and logic low levels respectively, counters 1A and 1B are loaded with the data signal carried by address bus 19, and when both of the S1 and S0 inputs are at logic high levels, the counters count upward. By applying predetermined signals to the S0, S1 and A-H inputs of the counters, the external control circuits CTRL facilitates resetting of the counters in order to regulate the coarse timing cycle length (in multiples of 16 nanoseconds).

In a successful prototype of the invention, a cycle length of up to 8192 nanoseconds was accommodated, corresponding to $2^9$ times the 16 nanosecond increment.

By utilizing two separate counters 1A and 1B, which will hereinafter be referred to as the even and odd counters respectively, which are clocked by oppositely phased clock signals $\phi1$ and $\phi2$ from circuit 2, relatively slow memories may be accessed. The QA-QH signal outputs of counter 1A are applied to a A0-A7 inputs of a pointer comparator memory 21 which contains a predetermined maximum count value for resetting the counters, as described below. D0-D3 data inputs thereof are connected to a data bus 23 connected to the controller CTRL. Pointer comparator memory 21 generate a reset signal on the O0-O3 outputs for resetting the counters in response to·a predetermined address location thereof being accessed. The control circuit CTRL then causes one or both of counters 1A and 1B to be cleared, or preset one at a time allowing a full 32 nanoseconds for accessing either one of memories 3A, 3B or 3C, 3D, which will hereinafter be referred to as the EVEN and ODD memories respectively.

According to the successful prototype, the shortest cycle repetition rate resulted in a cycle length of 32 nanoseconds.

As discussed above, the EVEN and ODD memories 3A, 3B and 3C, 3D contained 512 consecutive 8 bit words corresponding to 512, 16 nanosecond increments of eight phases of the coarse timing signal, which can be recycled after either of the EVEN or ODD memories has been accessed.

The EVEN and ODD memory circuits 3A, 3B and 3C, 3D are loaded via data inputs D0-D3 with predetermined data signals corresponding to the aforementioned coarse timing signal, under control of the external controller CTRL. The EVEN and ODD coarse timing signals are applied from the outputs O0-O3 of the EVEN and ODD memories to predetermined inputs of a plurality of muliplexing registers, 25A, 25B, 25C and 25D.

In particular, the four low order phases of the EVEN coarse timing signal, EM0-EM3 are applied from the O0-O3 outputs of RAM 3A to A1 and C1 inputs of registers 25A and 25B respectively. The four high order clock phases of the EVEN coarse timing signal are applied from the O0-O3 outputs of RAM 3B to the A1 and C1 inputs of registers 25C and 25D respectively. Similarly, respect ones of the OM0-OM3 and OM4-OM7 signals from the O0-O3 outputs of ODD memory RAMs 3C and 3D are applied to the A2 and C2 inputs of multiplexing registers 25A, 25B, 25C and 25D respectively.

The 100 1 clock signal from flip-flop 2B is applied to write select input W, of the multiplexing registers 25A-25D to select between the A1 or A2, B1 or B2, C1 or C2, and D1 or D2 inputs, and the master clock signal $\phi$, from circuit 2, is applied to the clock inputs of the registers 25A-25D. Thus, in operation, the multiplexing registers alternatively select the signals generated by the even and odd memories to appear on the QA, QB, QC and QD outputs.

Signals appearing on the QA and QC registers 25A-25D correspond to the aforementioned rising edge signals. Thus, according to the preferred embodiment illustrated in FIG. 3, 8 separate rising edge signals are generated, LE0-LE7.

As discussed above, the EVEN and ODD memories are clocked or sampled according to the preferred embodiment at 16 nanoseconds, although operation of the present invention is not limited to this clock rate. Simultaneously, flip-flop 2B generates a select signal $\phi1$ for multiplexing the inputs of registers 25A-25D at 16 nanosecond intervals. Each of the rising edge signals LE0-LE7 appearing on the QA and QC outputs of registers 25A-25D are fed back to the B1, B2 and D1, D2 inputs of the registers. Hence, falling edge signals TE0-TE7 appear on the QB and QD outputs of the registers 25A-25D, and are delayed versions of the corresponding rising edge signals LE0-LE7, delayed by 16 nanoseconds. Also, since respective ones of the rising and falling edge signals are latched through the same registers, the delays are matched, resulting in very accurate programmability of timing signal edges.

Thus, delay register 7 discussed with reference to FIG. 1 is realized according to the preferred embodiment of FIG. 3, by feeding back the rising edge signals to the input of the corresponding multiplexing registers.

Turning to FIG. 4, circuitry is shown for programming fine resolution timing edge increments for a predetermined one of the eight coarse timing clock phases, wherein the LE4 and TE4 rising falling edge signals are utilized as inputs. Identical circuits are utilized for processing each of the 8 clock phases, PH0-PH7 although only one such circuit is illustrated for ease of description.

A delay time register 27 is loaded with two 4 bit delay parameters from the external controller via data bus 23. The Q1-Q4 outputs of delay register 27 are connected to programming delay inputs of rising edge delay line 9, while the Q5-Q8 outputs of delay register 27 are connected to programming delay inputs of falling edge delay line 11. Thus, according to the preferred embodiment, sixteen one nanosecond delay increments are programmable within each of the delay lines 9 and 11.

The rising and falling edge delay lines 9 and 11 receive rising and falling edge signals, LE4 and TE4 respectively, via inputs IN thereof.

Inverted outputs OUT of delay lines 9 and 11 are connected to the inverting inputs of NAND gate 29.

By De Morgan's law, NAND gate 29, having inverted inputs, is the logical equivalent of OR gate 13 discussed with reference to FIG. 1. In the successful prototype, the inverted outputs OUT, of delay lines 9 and 11 were utilized since the propagation delay of the rising and falling edges is less using the inverted outputs than non-inverted, or "true" outputs which are also typically available on such delay lines.

The output signal PH4 from NAND gate 29 is applied to a first input of EXCLUSIVE OR gate 15D. A second input of EXCLUSIVE OR gate 15D is connected to the 5Q output of inversion register 17, discussed above with reference to FIG. 1.

Similarly, each of the clock phases PH0–PH7 are applied to respective ones of EXCLUSIVE OR gates 15A–15H, each of which has a second input thereof connected to one of the Q1–Q8 outputs of inversion register 17.

Thus, inversion register 17 is loaded from the external controller via data bus 23 to cause a predetermined one or more of the EXCLUSIVE OR gates 15A–15H to operate as an inverter, for inverting the clock phase input signal applied thereto, as discussed above with reference to FIG. 1. Thus, the outputs of EXCLUSIVE OR gates O1–O8 carry the programmed pulse signals illustrated in FIG. 2, for application to ancillary devices such as memory circuits, etc.

Consideration will now be given to an example of how to program a 7 nanosecond wide low going pulse which starts 45 nanoseconds from the beginning of the coarse memory timing cycle, utilizing clock phase 4 and a cycle repetition rate of 208 nanoseconds.

First of all, the external controller CTRL loads RAMs 3A, 3B, 3C and 3D with logic low signals in the first memory locations thereof. A logic high signal is loaded into the fifth bit (corresponding to phase 4, i.e. EM4) of the second location of RAM 3B, and a logic low signal is applied to the fifth bit in the second location of RAM 3D. Logic high signals are applied to the fifth bits of both the RAMs 3B and 3D in the third memory locations thereof, (corresponding to the 16 nanosecond time increment extending between 32 and 48 nanoseconds). Next, a logic low signal is stored in the fifth bit of RAM 3B and a logic high signal is stored in the fifth bit of RAM 3D in the fourth memory location. Logic low signals are stored in the fifth bits of the next thirteen memory locations of both the RAMs 3B and 3D corresponding to the remainder of the 208 nanosecond coarse timing signal cycle. Next, pointer comparator memory circuit 21 is loaded with a predetermined value for causing the controller CTRL to reset counters 1A and 1B after thirteen EVEN and ODD memory accesses have been performed.

Thus, in operation, the coarse timing memory circuit 5 generates a rising edge signal LE4 which makes a logic low to logic high transition at 16 nanoseconds and a logic high to low transition at 48 nanoseconds, while the falling edge signal makes a logic low to logic high transition at 32 nanoseconds and a logic high to low transition at 64 nanoseconds.

Next, the external controller loads delay register 27 with a hexadecimal value of 4B on the D1–D8 inputs thereof, via data bus 23. This results in a delay of 4 nanoseconds being programmed into rising edge delay line 9, and a 11 nanosecond delay being programmed into falling delay line 11.

Thus, rising edge delay line 9 generates a signal having a logic high to logic low level transition at 20 nanoseconds and a logic low to logic high level transition at 52 nanoseconds, while the inverted output of falling edge delay line 11 generates a signal having a logic high to logic low level transition at 45 nanoseconds and a logic low to logic high level transition at 75 nanoseconds. Consequently, the phase 4 clock output PH4 from NAND gate 29 is the desired 7 nanosecond wide low going pulse starting at 45 nanoseconds of the memory cycle.

External controller CTRL loads a logic low signal into the 5D input of inversion register 17, which causes a logic low signal to be applied to the second input of EXCLUSIVE OR gate 15D, while the phase 4 clock signal (PH4) is applied to the first input thereof. Thus, the output of EXCLUSIVE OR gate 15D carries the non-inverted clock phase signal PH4.

If it were desired to generate a 7 nanosecond wide high going pulse at 45 nanoseconds, the external controller would load a logic high signal into the 5D input of conversion register 17, which would cause a logic high signal to be applied to the second input of EXCLUSIVE OR gate 15D resulting in the output O4 thereof carrying an inverted version of the PH4 signal as discussed above.

According to the successful prototype, utilizing four 256×4 bit RAMs 3A–3D and a clock frequency of 62.5 megahertz, the edge programmability of clock pulses was found to be within ±2.5 nanoseconds accuracy. However, it is contemplated that the circuit may be implemented using ECL logic, and the rising and falling edge digital delay lines may be replaced by well known comparator and digital-to-analog converter arrangements, yielding accuracies in the order of 0.005% of the coarse timing cycle length.

The combined comparator and digital-to-analog converter arrangement is resynchronized to the clock 2 on each 16 nanosecond clock cycle, whereas TTL delay lines typically are much less accurate, particularly over longer pulse widths. This leads to very high accuracy.

A person understanding the present invention may conceive of other embodiments or modifications thereof. For example, a microprocessor controlled, gated inverter may be connected to the output of coarse timing circuit 5 discussed with reference to FIG. 1 instead of the external controller reloading memory circuit 3. Similarly, EXCLUSIVE OR gate 15 could be replaced with such an externally controlled and gated inverter.

A number of enhancements are also contemplated wherein a complex waveforms can be generated, by replacing the registers 25A–25D with registered memory outputs.

A first scheme for implementing such an enhancement has been contemplated whereby several pulses are programmed into the coarse timing memory circuit 5. At a predetermined instant of time, controlled by the coarse timing memories 3A–3D, a new delay parameter can be latched into the delay lines 9 and 11. In other words, the RAMs 3A–3D are loaded with delay parameters as well as the logic high and low coarse timing signal levels, such that the delay parameters can be latched into the delay lines in response to generation of a predetermined software flag for example, resulting in a multitude of varying delay parameters being latched into the delay lines within a single coarse timing signal cycle.

A second scheme has been contemplated whereby a predetermined number of high order memory locations in the RAMs 3A–3D are loaded with delay parameters as discussed above and latched via a high speed pattern generator (typically utilized in standard memory testing circuits), thereby selecting a particular set or bank of delay parameters in order to alter the programmed edges while the timing generator is running. Without such above described enhancements, the timing generator would have to be reset and reloaded, i.e. via register 27, each time a new pulse was to be programmed.

In addition, it is contemplated that the above described circuitry may be integrated and incorporated into a test head device for use with a memory testing circuit, for generating row and column address select signals, etc.

All these and other variations or modifications are considered to be within the sphere and scope of the present invention as defined in the claims appended hereto.

I claim:

1. An edge programmable timing signal generator, comprised of:
   (a) means for generating an input timing signal having predetermined logic high pulse width,
   (b) means for receiving and delaying said input timing signal by a predetermined length of time and generating a delayed input timing signal in response thereto,
   (c) means for receiving and delaying said input timing signal by a first variable length of time less than or equal to said predetermined length of time and generating a rising edge signal in response thereto,
   (d) means for receiving and delaying said delayed input timing signal by a second variable length of time less than or equal to said predetermined length of time and generating a falling edge signal in response thereto,
   (e) means for receiving and performing a logic OR operation on said rising and falling edge signals and generating a first output signal in response thereto, and
   (f) means for selectively inverting said input and output signals and generating a second output signal in response thereto,
   whereby said first output signal has a logic high pulse width variable between said predetermined pulse width and said predetermined pulse width extended by twice said predetermined length of time in response to variations in said first and second variable lengths of time, and said second output signal has a logic high pulse width variable between said predetermined pulse width and said predetermined pulse width diminished by twice said predetermined length of time in response to variations in said first and second variable lengths of time.

2. An edge programmable timing signal generator as defined in claim 1, wherein said means for receiving and delaying said input timing signal by said first predetermined length of time is comprised of a delay register.

3. An edge programmable timing signal generator as defined in claim 2, wherein said means for receiving and delaying said input timing signal and delayed input timing signal by said first and second variable lengths of time respectively, are each comprised of programmable digital delay lines.

4. An edge programmable timing signal generator as defined in claim 3, wherein said means for performing a logic OR operation is an OR gate.

5. An edge programmable timing signal generator as defined in claim 4, wherein said means for selectively inverting said input and output signals is comprised of circuitry for selectively inverting said input signal and an EXCLUSIVE OR gate having a first input connected to said OR gate and a second input connected to a programmable source of logic high and low signals, for selectively inverting said output signals.

6. An edge programmable timing signal generator as defined in claim 1, wherein said first predetermined length of time is 16 nanoseconds.

7. An edge programmable timing signal generator as defined in claim 4, wherein said first predetermined length of time is 16 nanoseconds.

8. An edge programmable timing signal generator as defined in claim 2, wherein said first predetermined length of time is 16 nanoseconds.

9. An edge programmable timing signal generator as defined in claim 5, wherein said first predetermined length of time is 16 nanoseconds.

10. An edge programmable timing signal generator as defined in claim 3, wherein said first predetermined length of time is 16 nanoseconds.

11. An edge programmable timing signal generator, comprised of
   (a) a coarse timing circuit for generating an input timing signal having a predetermined high going pulse width,
   (b) a delay register for receiving and delaying said input timing signal by a first predetermined length of time, and generating a delayed input signal in response thereto,
   (c) a first delay line connected to said coarse timing circuit, for receiving and delaying said input timing signal by a second predetermined length of time less than or equal to said first length of time and generating a rising edge signal in response thereto,
   (d) a second delay line connected to said delay register for receiving and delaying said delayed input signal by a third predetermined length of time less than or equal to said first predetermined length of time, and generating a falling edge signal in response thereto,
   (e) an OR gate having inputs connected to said first and second delay lines, for receiving said rising and falling edge signals, performing a logic OR operation thereon and generating a first output signal having a high going pulse width variable between said predetermined pulse width and said predetermined pulse width extended by twice said first predetermined length of time, and
   (f) means for inverting said input and output signals and generating a second output signal having a high going pulse width variable between said predetermined pulse width and said predetermined pulse width diminished by twice said first predetermined length of time.

12. An edge programmable timing signal generator as defined in claim 6 wherein said coarse timing circuit is comprised of a preloadable memory addressed by a free running counter, said memory being loaded with a plurality of predetermined digital signals representing said input timing signal.

13. An edge programmable timing signal generator as defined in claim 12, wherein said means for inverting said input and output signals is comprised of circuitry for loading said memory with inverted versions of said plurality of predetermined digital signals for inverting said input signal, and an EXCLUSIVE OR gate having a first input connected to said OR gate for receiving said first output signal and a second input connected to a programmable clock phase inversion register for selectively applying a logic high level signal to the second input of said EXCLUSIVE OR gate.

14. An edge programmable timing signal generator as defined in claim 13, wherein said delay register is latched by an external enabling circuit according to a generated clock signal and has at least one output connected to a predetermined input thereof, such that said received input signal is fed back from said output to said predetermined input and clocked by said external enabling circuit so as to be delayed by one clock signal cycle.

15. An edge programmable timing signal generator as defined in claim 12, wherein said first predetermined length of time is 16 nanoseconds.

16. An edge programmable timing signal generator as defined in claim 13, wherein said first predetermined length of time is 16 nanoseconds.

17. An edge programmable timing signal generator as defined in claim 11, wherein said first predetermined length of time is 16 nanoseconds.

18. An edge programmable timing signal generator as defined in claim 14, wherein said first predetermined length of time is 16 nanoseconds.

19. A method of generating an output timing signal having variable positive pulse width, comprising the steps of (a) generating an input timing signal having a predetermined logic high pulse width, (b) receiving and delaying said input timing signal by a first predetermined length of time and generating a delayed input timing signal in response thereto, (c) receiving and delaying said input timing signal by a second predetermined length of time less than or equal to said first predetermined length of time and generating a rising edge signal in response thereto, (d) receiving and delaying said delayed input timing signal by a third predetermined length of time less than or equal to said first predetermined length of time and generating a falling edge signal in response thereto, (e) receiving and performing a logic OR operation on said rising and falling edge signals and generating a first output signal in response thereto, and (f) selectively inverting said input and output signals and generating a second output signal in response thereto, whereby said first output signal has a logic high pulse width variable between said predetermined pulse width and said predetermined pulse width extended by twice said first predetermined length of time in response to variations in said second and third predetermined lengths of time, and said second output signal has a logic high pulse width variable between said predetermined pulse width and said predetermined pulse width diminished by twice said first predetermined length of time in response to variations in said second and third predetermined lengths of time.

* * * * *